United States Patent [19]

Nagai et al.

[11] Patent Number: 5,352,762
[45] Date of Patent: Oct. 4, 1994

[54] MULTILAYER PRINTED CIRCUIT BOARD AND PRODUCTION THEREOF

[75] Inventors: Akira Nagai; Shin Nishimura, both of Hitachi; Masahiro Suzuki, Iwaki; Masao Suzuki, Hitachi; Junichi Katagiri, Ibaraki; Akio Takahashi, Hitachiota; Akio Mukoh, Mito, all of Japan

[73] Assignee: Hitachi, Ltd., Tokyo, Japan

[21] Appl. No.: 676,383

[22] Filed: Mar. 28, 1991

[30] Foreign Application Priority Data

Mar. 30, 1990 [JP] Japan .................. 2-080754

[51] Int. Cl.$^5$ .................. C08G 83/00; C08G 73/12
[52] U.S. Cl. .................. 528/322; 528/97; 528/98; 528/103; 528/117; 528/119; 528/211; 528/392; 528/422; 428/224; 428/411.1; 428/423.1; 428/901; 526/262
[58] Field of Search .............. 528/422, 322, 392, 103, 528/211, 117, 97, 98, 119; 428/901, 411.1, 224, 423.1; 526/262

[56] References Cited

U.S. PATENT DOCUMENTS

| Re. 28,495 | 7/1975 | Langager | 528/422 |
|---|---|---|---|
| 3,944,526 | 3/1976 | Kray | 524/609 |
| 4,049,711 | 9/1977 | Kray | 564/105 |
| 4,075,185 | 2/1978 | Kray | 528/391 |
| 4,080,483 | 3/1978 | Kray | 528/422 |
| 4,559,394 | 12/1985 | McDaniel | 526/106 |
| 4,745,215 | 5/1988 | Cox et al. | 528/422 |
| 4,755,911 | 7/1988 | Suzuki | 428/422 |
| 4,769,440 | 9/1988 | Hefner, Jr. | 528/422 |
| 4,820,797 | 4/1989 | Hefner, Jr. | 528/422 |
| 4,820,798 | 4/1989 | Hefner, Jr. | 528/422 |
| 4,824,511 | 4/1989 | Hartman et al. | 428/422 |
| 4,861,823 | 8/1989 | Qureshi | 528/422 |
| 4,904,760 | 2/1990 | Gaku et al. | 528/422 |
| 4,918,157 | 4/1990 | Gardner et al. | 528/422 |

FOREIGN PATENT DOCUMENTS

| 0059434 | 9/1982 | European Pat. Off. . |
| 0153603 | 9/1985 | European Pat. Off. . |
| 0202498 | 11/1986 | European Pat. Off. . |
| 0364785 | 4/1990 | European Pat. Off. . |

OTHER PUBLICATIONS

CA 115(20):209414a.
CA 112(4):21802j.
CA 115(10):93553p.
CA 117(6):60948.
CA 116(8):74401s.
CA 116(20):195510k.
CA 116(20):195508r.
CA 116(14):130399m.
CA 116(4):22235w.

Primary Examiner—John Kight, III
Assistant Examiner—P. Hampton-Hightower
Attorney, Agent, or Firm—Antonelli, Terry, Stout & Kraus

[57] ABSTRACT

A multilayer printed circuit board comprising a plurality of alternately laminated layers of insulating layers and circuit conductor layers having a signal transmission delay time of 6.0 ns/m or less, excellent in heat resistance, adhesive, fire retardance, etc. can be produced by forming insulating layers using a fluorine-containing thermosetting resin composition.

4 Claims, 4 Drawing Sheets

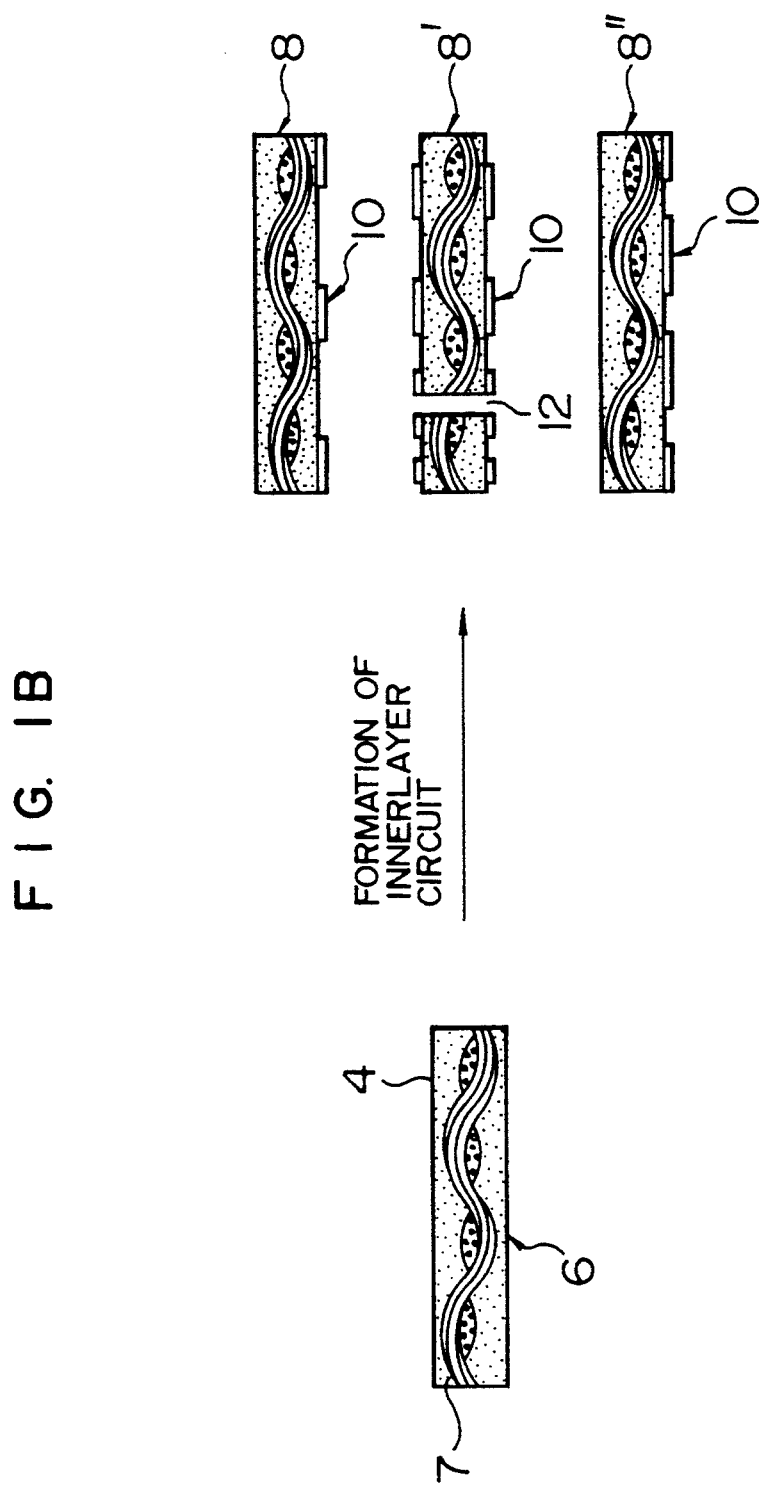

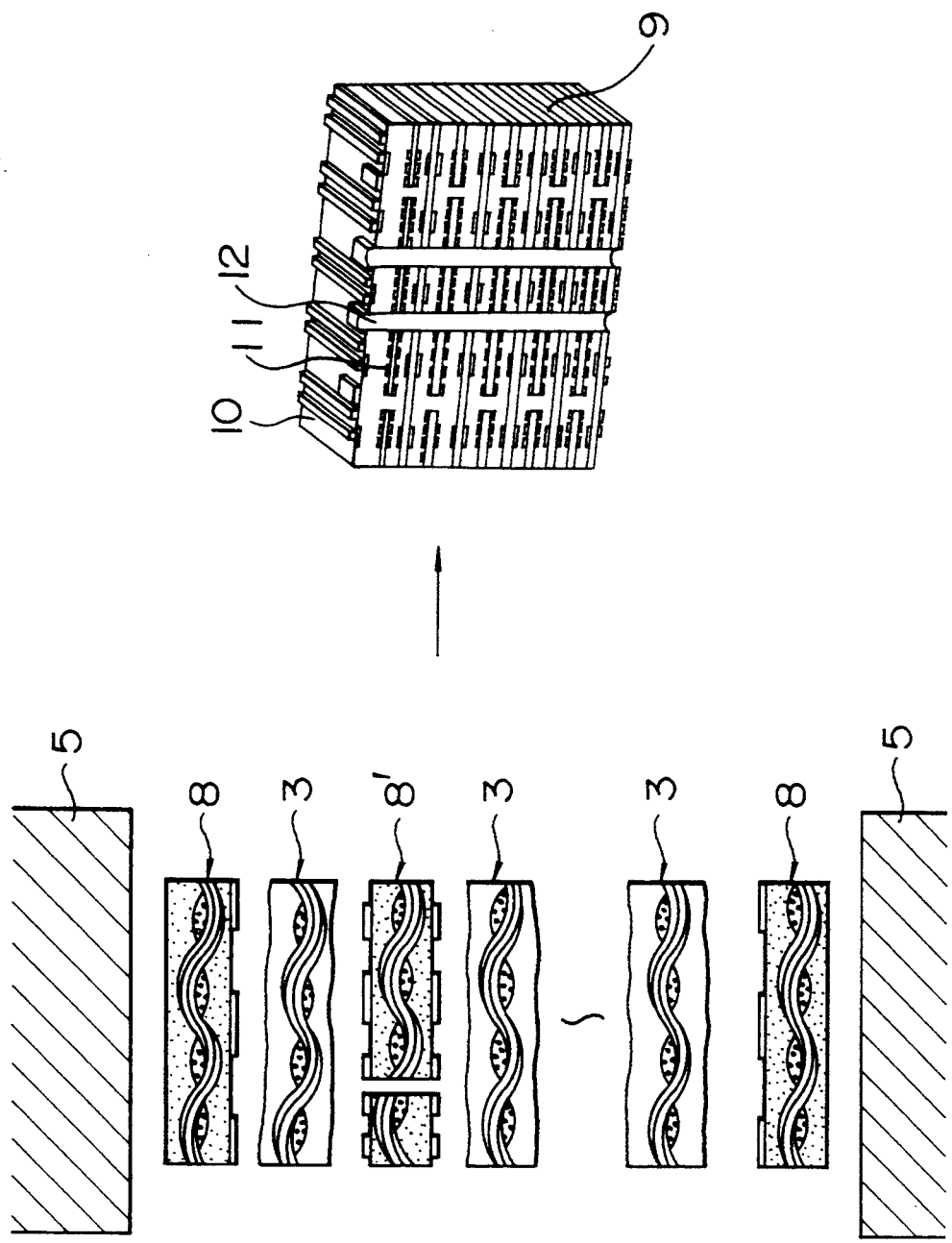

MULTILAYER PRINTED CIRCUIT BOARD AND PRODUCTION THEREOF

BACKGROUND OF THE INVENTION

This invention relates to a multilayer printed circuit board, a process for producing the same and a thermosetting resin composition usuable as insulating material for such a multilayer printed circuit board, etc. More particularly, the present invention relates to a multilayer printed circuit board having a high density, a high signal transmission speed and flame retardance, and a process for producing the same.

Recently, large-sized electronic computers are required to have a higher density, and high speed operation. Thus, multilayer printed circuit boards used therefor are also required to show such properties with severe demands. Generally speaking, the operation speed of an electronic computer is greatly influenced by the signal transmission speed of circuits in multilayer printed circuit boards. In order to improve the signal transmission speed of circuits, it is necessary to develop flame retardant resin materials excellent in adhesiveness to conductor circuit layers (mainly made of copper).

Fluorine-containing materials heretofore used such as polytetrafluoroethylene (PTFE) are thermoplastic resins, so that there were problems in poor dimensional stability and poor through hole reliability when used in multilayer printed circuit boards. Further, since there were no suitable solvents, adhesion of laminated layers should have been conducted by a melt pressure bonding method. But since the melting temperature was so high (e.g. 250° to 350° C.) that there were problems in that the workability was poor and the handling was difficult compared with epoxy resins and the like.

On the other hand, there is developed a resin material comprising 1,2-polybutadiene having double bonds at side chains and a cross-linking type fire retardant of bifunctional monomer (Japanese Patent Unexamined Publication No. 55-1264751). But when a low molecular weight polymer is used considering impregnating properties into fibrous substrates, the resulting prepreg is poor in cutting processing and storage due to high adhesiveness of the prepreg, and also influences workability at the time of bonding of laminated layers.

A material for producing a multilayer printed circuit board containing a cyanate compound is disclosed in U.S. Pat. No. 4,559,394.

SUMMARY OF THE INVENTION

It is an object of the present invention to provide a multilayer printed circuit board obtained by using a thermosetting resin composition with good moldability for forming insulating layers low in dielectric constant and excellent in heat resistance, adhesiveness, fire retardance and moisture resistance. It is another object of the present invention to provide a process for producing such a multilayer printed circuit board. It is a further object of the present invention to provide a semiconductor device and an electronic device using such a multilayer printed circuit board.

The present invention provide a multilayer printed circuit board comprising a plurality of alternately laminated layers of insulating layers and circuit conductor layers, and a circuit conductor layer formed on at least one outer surface of the laminated layers, said insulating layers being made from a cured product of a fluorine-containing thermosetting resin composition comprising a biscyanamide compound of the formula:

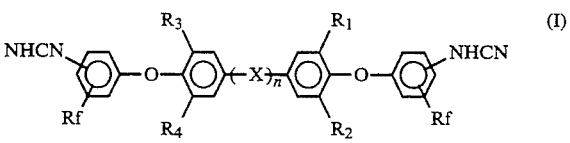

wherein X is —O—, —S—, —SO—, —SO$_2$—, —CO— or

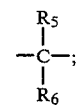

$R_1$, $R_2$, $R_3$, $R_4$, $R_5$ and $R_6$ are independently a hydrogen atom, a lower alkyl group, a lower fluoroalkyl group or an allylene group; Rf is a perfluoroalkyl group having 1 to 10 carbon atoms; n is zero or an integer of 1; and the cyanamide group is positioned at a m- or p-position with respect to the ether linkage.

The present invention also provide a process for producing a multilayer printed circuit board which comprises (a) a step of preparing a prepolymer by heating and/or exposing to light a fluorine-containing thermosetting resin composition, (b) a step of forming a curable sheet by impregnating a fibrous material with a solution obtained by dissolving the prepolymer in a solvent, (c) a step of forming a metal foil-clad laminate by laminating and bonding at least one curable sheet obtained above and a metal foil for circuit conductor under pressure with heating, (d) a step of forming an innerlayer circuit substrate having circuits with a circuit conductor width (w) of 10 to 50 μm, a circuit conductor thickness (t) of 50 to 200 μm, and an aspect ratio (t/w) of 1.0 to 20 on at least one side of the metal foil-clad laminate, and (e) a step of laminating alternately a plurality of the curable sheets and a plurality of innerlayer circuit substrates and heating under pressure for bonding so as to make at least one surface of the laminated layers a circuit conductor layer.

The present invention further provides an electronic device or a semiconductor device using such a multilayer printed circuit board.

The present invention still further provides a fluorine-containing thermosetting resin composition comprising 100 parts by weight of a biscyanamide compound of the formula (I) and 10 to 900 parts by weight a thermosetting secondary component, and an insulating cured product obtained therefrom.

BRIEF DESCRIPTION OF THE DRAWINGS

FIG. 1B is a schematic cross-sectional view of interlayer substrate before and after formation of inner-layer circuits.

FIG. 1C is a perspective view with cross-section of a multilayer printed circuit board and a step of production thereof.

DESCRIPTION OF THE PREFERRED EMBODIMENTS

Figure 1A:
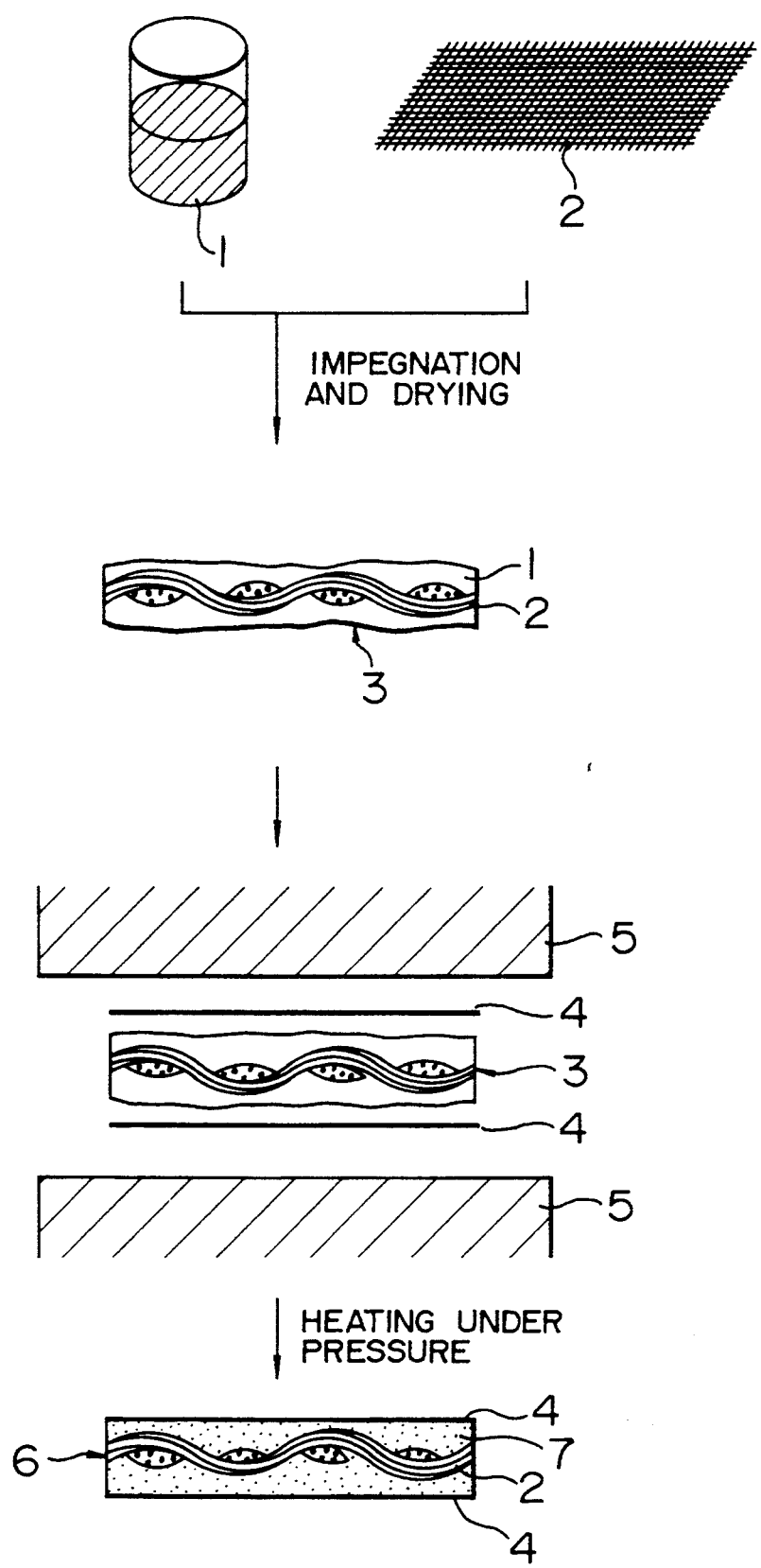
FIG. 1A is a schematic view explaining a process for producing a double-sided copper-clad laminate.

The multilayer printed circuit board comprising a plurality of alternately laminated layers of insulating layers and circuit conductor layers, and a circuit conductor layer formed on at least one outer surface of the laminated layers of the present invention is characterized by forming the insulating layers by curing curable sheets obtained by impregnating a fibrous material with a fluorine-containing thermosetting resin composition comprising a biscyanamide compound of the formula:

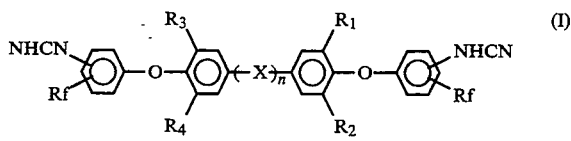

wherein X is —O—, —S—, —SO—, —SO$_2$—, —CO— or

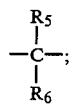

$R_1$, $R_2$, $R_3$, $R_4$, $R_5$ and $R_6$ are independently a hydrogen atom, a lower alkyl group, preferably having 1 to 4 carbon atoms, a lower fluoroalkyl group preferably having 1 to 4 carbon atoms, or an allylene group; Rf is a perfluoroalkyl group having 1 to 10 carbon atoms; n is zero or an integer of 1; and the cyanamide group is positioned at a m- or p-position with respect to the ether linkage. The resulting cured insulating layers have a relative dielectric constant ($\epsilon$) of 3.0 or less at 1 MHz, fire retardance of the grade of V-O by the UL-94 standards, a 5% weight loss temperature of 400° C. or higher, and a peel strength of 1.0 kg/cm or more. By using such insulating layers, it is possible to provide a low thermal expansion coefficient, good thermal dimensional stability due to a low shrinkage, improved adhesiveness to the metal of circuit conductor layers and improved moisture resistance.

The fluorine-containing thermosetting resin composition comprising a biscyanamide compound of the formula (I) gives a three-dimensionally crosslinked cured product with heating. At the time of heating, the biscyanamide group in the formula (I) forms in the chemical structure a hetero ring such as a melamine ring and/or isomelamine ring which are excellent in heat resistance and fire retardance. The present invention is characterized by forming a cured product containing melamine rings and/or isomelamine rings with suitable amounts of fluorine-containing groups. That is, when the substitution with the fluorine-containing group is too much, a hetero ring forming ability is reduced to lower heat resistance. On the other hand, when the substitution with the fluorine-containing group is too little, it is difficult to attain a low relative dielectric constant. Further, a more surprising thing is that the cured product of the compound of the formula (I) is excellent in adhesive strength (peel strength) to copper which forms a circuit conductor layer. This is quite different from ordinary fluorine-containing resin such as PTFE which is remarkably low in the adhesive strength (peel strength) to a metal such as copper. This is very important properties for making the multilayer printed circuit board with more layers and higher density and preventing troubles such as peeling of individual layers. Further, according to the present invention, good fire retardance can be obtained without adding a fire retardant due to interaction caused by mixing with suitable proportions of the hetero ring linkage and the fluorine atom.

The multilayer printed circuit board comprising a plurality of alternately laminated layers of insulating layers obtained by curing the curable sheets with heating and circuit conductor layers wherein the insulating layers have a thickness (h) of 200 to 500 μm and relative dielectric constant ($\epsilon$) at 1 MHz of 3.0 or less and the circuit conductor layers have a circuit conductor width (w) of 10 to 50 μm, a circuit conductor thickness (t) of 50 to 200 μm, and an aspect ratio (t/w) of 1.0 to 20, can attain a higher mounting density of 1.2 to 2.0 times larger than that of known multilayer printed circuit boards. Further, the signal transmission delay time of the circuit conductor layer becomes 6.0 ns/m or less, resulting in attaining higher speed operation comparing with known multilayer printed circuit boards.

In order to make the above-mentioned effects more effective, it is preferable to design so as to make the thickness of insulating layer (h) 260 to 460 μm, the relative dielectric constant ($\epsilon$) 2.2 to 3.0, the circuit conductor width (w) 20 to 50 μm, the circuit conductor thickness (t) 60 to 150 μm, and the aspect ratio (t/w) 1.5 to 6.0. When the aspect ratio becomes more than 6.0, the wiring pattern thickness (t) becomes as thick as 150 μm or more, resulting in often making it difficult to obtain a thinner multilayer printed circuit board.

As the fluorine-containing biscyanamide compound of the formula (I), the following compounds can be used:

1,1,1,3,3,3-hexafluoro-2,2-bis[4-(2-trifluoromethyl-4-cyanamidephenoxy) phenyl]propane, 1,1,1,2,2,4,4,5,5,5-decafluoro-3,3-bis[4-(2-trifluoromethyl-4-cyanamidephenoxy) phenyl]pentane, 1,1,1,3,3,3-hexafluoro-2,2-bis[4-(2-pentafluoroethyl-4-cyanamidephenoxy) phenyl]propane, 1,1,1,3,3,3-hexafluoro-2,2-bis[4-(2-heptafluoropropyl-4-cyanamidephenoxy) phenyl]propane, 1,1,1,3,3,3-hexafluoro-2,2-bis[4-(3-trifluoromethyl-4-cyanamidephenoxy) phenyl]propane, 1,1,1,3,3,3-hexafluoro-2,2-bis[4-(3-trifluoromethyl-5-cyanamidephenoxy) phenyl]propane, 1,1,1,3,3,3-hexafluoro-2,2-bis[4-(2-trifluoromethyl-5-cyanamidephenoxy) phenyl]propane, 1,1,1,3,3,3-hexafluoro-2,2-bis[4-(2-trifluoromethyl-3-cyanamidephenoxy) phenyl]propane, 4,4'-bis(2-trifluoromethyl-4-cyanamidephenoxy)-biphenyl, bis[4-(2-trifluoromethyl-4-cyanamidephenoxy)-phenyl]ether, bis[4-(2-trifluoromethyl-4-cyanamidephenoxy)-phenyl]sulfide, bis[4-(2-trifluoromethyl-4,cyanamidephenoxy)-phenyl]sulfoxide, bis[4-(2-trifluoromethyl-4-cyanamidephenoxy)-phenyl]sulfone, bis[4-(2-trifluoromethyl-4-cyanamidephenoxy)-phenyl]ketone, bis[4-(2-trifluoromethyl-4-cyanamidephenoxy)-phenyl]methane,
2,2-bis[4-(2-trifluoromethyl-4-cyanamidephenoxy)-phenyl]propane, etc.

The fluorine-containing thermosetting resin composition is particularly effective when the composition comprises 100 parts by weight of the biscyanamide compound of the formula (I) and 10 to 200 parts by weight of a thermosetting secondary component.

As the thermosetting secondary component, there can be used at least one compounds selected from compounds having one or more ethylenically unsaturated double bonds, epoxy compounds, phenolic compounds, melamine compounds, compounds having an N-substituted unsaturated imido group, cyanate compounds, isocyanate compounds and cyanamide compounds except for those of the formula (I). Among them, the use of epoxy compounds, phenolic compounds, melamine compounds, compounds having an N-substituted unsaturated imido group, and a mixture thereof, is preferable.

As the epoxy compounds, there can be used 2,2-bis[4-(2,3-epoxypropoxy)phenyl]propane, 1,1,1,3,3,3-hexafluoro-2,2-bis[4-(2,3-epoxypropoxy) phenyl]propane, bis(2,3-epoxypropyl) terephthalate, bis(2,3-epoxypropyl) isophthalate, bis(2,3-epoxypropyl) phthalate, 1,3,5-tris(2,3-epoxypropyl)phloroglucinol, 4,4-bis(2,3-epoxypropylphenyl) ether, 2-(2,3-epoxypropyl)phenyl-2,3-epoxypropyl ether, 2,2-bis[4-(2,3-epoxypropoxy)-3,5-dibromophenyl]propane, 1,1,2,2-tetrakis[4-(2,3-epoxypropoxy)phenyl]ethane, polyphenol-formaldehyde-poly(2,3-epoxypropyl) ether, poly-o-cresol-formaldehydepoly(2,3-epoxypropyl) ether, 1,4-bis(2,3-epoxypropoxy)butane, 1,2-bis(2,3-epoxy-2-methylpropoxy)ethane, 1,3-bis[3-(2,3-epoxypropoxy)propyl]tetramethyldisiloxane, epoxidized polybutadiene, polypropylene glycol-di(2,3-epoxypropyl) ether, 1,2,3-tris(2,3-epoxypropoxy)propane, 2,3-epoxypropylallyl ether telomer, 2,6-bis(2,3-epoxypropoxy)norbornene, 2,2-bis[4-(2,3-epoxypropoxy)cyclohexyl]propane, 4-(1,2-epoxyethyl)-1,2-epoxycyclohexane, etc.

When an epoxy compound is used, it is possible to use together a conventional curing agent for the epoxy resin and a curing accelerator (e.g. disclosed in H. Kakiuchi: Epoxy Resin. pp. 109–149, published by Shokodo (1965)).

As the phenolic compounds, there can be used novolak type or resol type phenol-formaldehyde condensates obtained from a phenol such as phenol, cresol, xylenol, trimethylphenol, trifluoromethylphenol, p-hydroxystyrene, etc.

As the melamine compounds, there can be used melamine, benzoguanine, dicyanediamide, vinyltriazine, hydroxytriazine, o-tolylbiguanide, 1,3-di-o-triguanidine, 1,3-diphenylguanidine, propyltriazine, or a reaction condensate of melamine and an aidehyde.

As the compounds having an N-substituted unsaturated imido group, there can be used o-phenylmaleimide, m-phenylmaleimide, p-phenylmaleimide, phenylcitraconimide, phenylitaconimide, phenylnadicimide, phenylmethylendomethylenetetrahydrophthalimide, N,N'-p-phenylenedismaleimide, N,N'-p-phenylenebismethylendomethylenetetrahydrophthalimide, N,N'-p-phenylenebiscitraconimide, N,N'-p-phenylenebisitaconimide, N,N'-m-xylenebismaleimide, N,N'-m-phenylenebismaleimide, N,N'-(methylenedi-p-phenylene)bismaleimide, N,N'-4,4'-di(phenylthioether)-bismaleimide, N,N'-4,4'm-di(diphenylether)bismaleimide, N,N'-methylenebis(3-chloro-phenylene) maleimide, N,N'-(sulfonyldi-p-phenylene) bismaleimide, N,N'-4,4'-di(phenylcyclohexane)bismaleimide, 2,2-bis[4-(4-maleimidephenoxy)phenyl]propane, 2,2-bis[4-(4-maleimidephenoxy)phenyl]-1,1,1,3,3,3-hexafluoropropane, 2,2-bis[4-(4-maleimide-2-trifluoromethylphenoxy)phenyl]-1,1,1,3,3,3-hexafluoropropane, and the like bismaleimides.

It is also possible to use a polyvalent maleimide obtained by reacting a condensate of aniline and an aldehyde with maleic anhydride and represented by the formula:

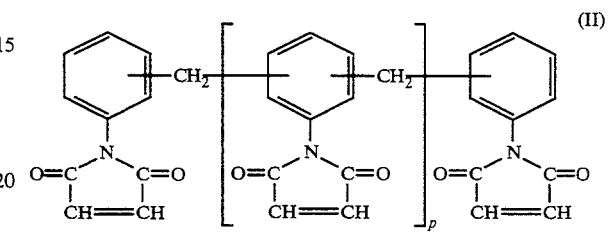

(II)

wherein p is an integer of 1 to 10.

Other suitable maleimide compounds are 2,2-bis[4-(4-maleimidephenoxy)phenyl]propane, 2,2-bis[3-methyl-4-(4-maleimidephenoxy)phenyl]propane, 2,2-bis[chloro-4-(4-maleimidephenoxy)phenyl]propane, 2,2-bis[3-bromo-4-(4-maleimidephenoxy)phenyl)propane, 2,2-bis[3-ethyl-4-(4-maleimidephenoxy)phenyl]propane, 2,2-bis[3-propyl-4-(4-maleimidephenoxy)phenyl]propane, 2,2-bis[3-isopropyl-4-(4-maleimidephenoxy)pheny! ]propane, 2,2-bis[3-butyl-4-(4-maleimidephenoxy)phenyl]propane, 2,2-bis[3-sec-butyl-4-(4-maleimidephenoxy)phenyl]propane, 2,2-bis[3-methoxy-4-(4-maleimidephenoxy)phenyl]propane, 1,1-bis[4-(4-maleimidephenoxy)phenyl]ethane, 1,1-bis[3-methyl-4-(4-maleimidephenoxy)phenyl]ethane, 1,1-bis[3-chloro-4-(4-maleimidephenoxy)phenyl]ethane, 1,1-bis[3-bromo-4-(4-maleimidephenoxy)phenyl]ethane, bis[4-(4-maleimidephenoxy)phenyl]methane, bis[3-methyl-4-(4-maleimidephenoxy)phenyl]methane, bis[3-chloro-4-(4-maleimidephenoxy)phenyl]methane, bis[3-bromo-4-(4-maleimidepehnoxy)phenyl]methane, bis[3-bromo-4-(4-maleimidephenoxy)phenyl]methane, 1,1,1,3,3,3-hexafluoro-2,2-bis[4-(4-maleimidephenoxy)phenyl]propane, 1,1,1,3,3,3-hexachloro-2,2-bis[4-(4-maleimidephenoxy)-phenyl]propane, 3,3-bis[4-(4-maleimidephenoxy)-phenyl]pentane, 1,1-bis[4-(4-maleimidephenoxy)-phenyl]propane, 1,1,1,3,3,3-hexafluoro-2,2-bis[3,5-dibromo-4-(4-maleimidephenoxy)phenyl]propane, 1,1,1,3,3,3-hexafluoro-2,2-bis[3-methyl-4-(4-maleimidephenoxy)phenyl]propane, etc.

The compounds of the formula:

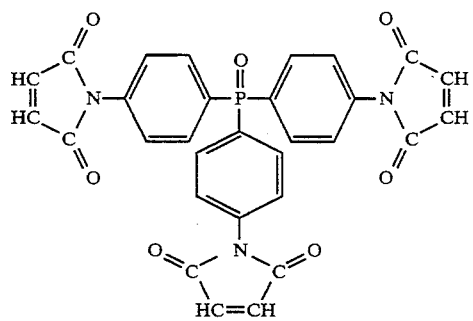

-continued

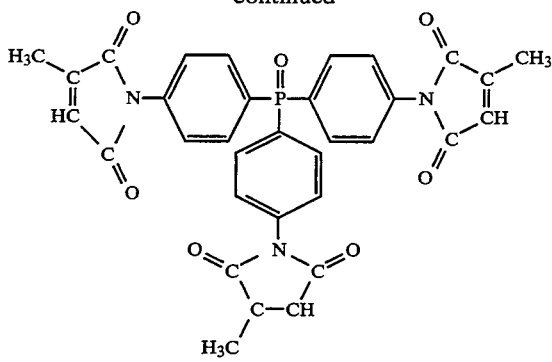

are effective for improving heat resistance and fire retardancy imparting effect. Thus, these compounds are particularly effective for obtaining balanced effects.

The composition containing a biscyanamide compound of the formula (I) is subjected to polymerization reaction using a radical polymerization reaction.

As the radical polymerization initiator, there can be used benzoyl peroxide, para-chlorobenzoyl peroxide, 2,4-dichlorobenzoyl peroxide, lauroyl peroxide, dicumyl peroxide, acetyl peroxide, methyl ethyl ketone peroxide, cyclohexanone peroxide, bis(1-hydroxycyclohexyl peroxide), 2,5-bimethylhexane-2,5-dihydro peroxide, t-butyl perbenzoate, 2,5-dimethyl-2,5-(t-butyl-peroxy)hexane, 2,5-dimethyl-2,5-(t-butyl peroxy)hexyl-3, 2,5-dimethylhexyl-2,5-di(peroxybenzoate), cumene hydroperoxide, t-butyl hydroperoxide, t-butyl peroxybenzoate, t-butyl peroxyacetate, t-butyl peroxyoctate, t-butyl peroxyisobutylate, dibenzyl peroxide, di-t-butyl peroxyphthalate, etc. These radical polymerization initiators can be used alone or as a mixture thereof.

The radical polymerization initiator is used in an amount of preferably 0.01 to 5 parts by weight, more preferably 0.05 to 3 parts by weight, per 100 parts by weight of the resin composition.

As a catalyst for forming a melamine ring and/or an isomelamine ring by trimerization of the cyamide group, there can be used metal salts such as cobalt naphthanate, cobalt octanoate, zinc octanoate, potassium acetate, sodium acetate, sodium cyanide, sodium cyanate, isocyanic acid, sodium borohydride, etc.; sodium methoxide, sodium hydroxide; salts of pyridine; tertiary amines such as triethylamine, etc.; Lewis acids such as aluminum chloride, bromine trifluoride, ferric chloride, titanium chloride, zinc chloride, etc.

The fluorine-containing thermosetting resin composition comprising a biscyanamide compound of the formula (I) can be used in the form of a curable sheet such as a prepreg, an impregnated mat, etc. to form printed circuit boards, multilayer wiring substrates, etc.

The multilayer printed circuit board can be produced by a process which comprises (a) a step of preparing a prepolymer by heating and/or exposing to light a fluorine-containing thermosetting resin composition comprising a biscyanamide compound preferably having the formula (I), (b) a step of forming a curable sheet by impregnating a fibrous material with a solution obtained by dissolving the prepolymer in a solvent, (c) a step of forming a metal foil-clad laminate by laminating and bonding at least one curable sheet obtained above and a metal foil for circuit conductor under pressure with heating, (d) a step of forming an innerlayer circuit substrate having circuits with a circuit conductor width (w) of 10 to 50 μm, a circuit conductor thickness (t) of 50 to 200 μm, and an aspect ratio (t/w) of 1.0 to 20 on at least one side of the metal foil-clad laminate, and (e) a step of laminating alternately a plurality of the curable sheets and a plurality of innerlayer circuit substrates and heating under pressure for bonding so as to make at least one surface of the laminated layers a circuit conductor layer.

Such a process is explained hereinafter referring to FIGS. 1A to 1C.

As shown in FIG. 1A, a resin composition (uncured) 1 containing a biscyanamide compound of the formula (I) is dissolved in a solvent to prepare a varnish with a predetermined concentration. In order to accelerate the dissolution or in order to proceed the reaction slightly, heating can be employed.

As the solvent, there can preferably be used water, toluene, xylene, acetone, methanol, ethanol, methyl ethyl ketone, methyl isobutyl ketone, 3-methoxypropanol, 2-methoxyethanol, N,N-dimethylformamide, N-methylpyrrolidone, dimethylsulfoxide, trichloroethylene, 1,1,2-trichloroethane, tetrahydrofuran, dichloromethane, diisobuytyl ether, trichlorotrifluoroethane, etc., alone or as a mixture thereof.

The curable sheet (or coated cloth or prepreg) 3 can be obtained by impregnating (or coating) a sheet-like material such as glass cloth 2 with the varnish for impregnation thus obtained, followed by removal of the solvent and drying. The impregnation or coating temperature depends on the solvent and polymerization initiator used.

In the curable sheet, the resin composition has a viscosity of $10^2$ to $10^4$ poises when melted with heating at 100° to 170° C. and capacity of forming melamine rings and/or isomelamine rings when heated at 180° C. or higher.

A copper-clad laminate 6 can be obtained by laminating a predetermined number of the coated cloth 3 (one sheet being possible) and a metal foil 4 (e.g. copper foil) on one side or both sides of the coated cloth, and heating at 100° to 250° C. under a pressure of 1 to 100 kg/cm² using a hot plate 5. Numeral 7 denotes a cured resin.

As the sheet-like material 2, there can be used woven fabric, non-woven fabric, film, and the like conventionally used laminating materials. More concretely, there can be used woven fabric and non-woven fabric made from various glass fibers such as E glass, C glass, A glass, T glass, D glass, Q glass, etc. having silica, alumina, etc. as components; woven fabric, non-woven fabric, and film made from aramide, fluorine polymers such as polytetrafluoroethylene, polyamides, polyimides, polyethers, polyesters, etc.

As shown in FIG. 1B, at least one side of the copper-clad laminate 6 is etched to form an innerlayer circuit and innerlayer circuit substrates 8, 8' and 8'' are formed. Numeral 10 denotes a printed circuit and numeral 12 denotes a through hole. As shown in FIG. 1C, the innerlayer circuit substrates (conductor circuit layers) 8, 8' and 8'' and curable sheets 3 are laminated alternately and heated using a pair of hot plates 5 at 100 to 250° C. under a pressure of 1 to 100 kg/cm² to form a multilayer printed circuit substrate (or board) 9. Numeral 11 denotes innerlayer circuits.

Figure 2:
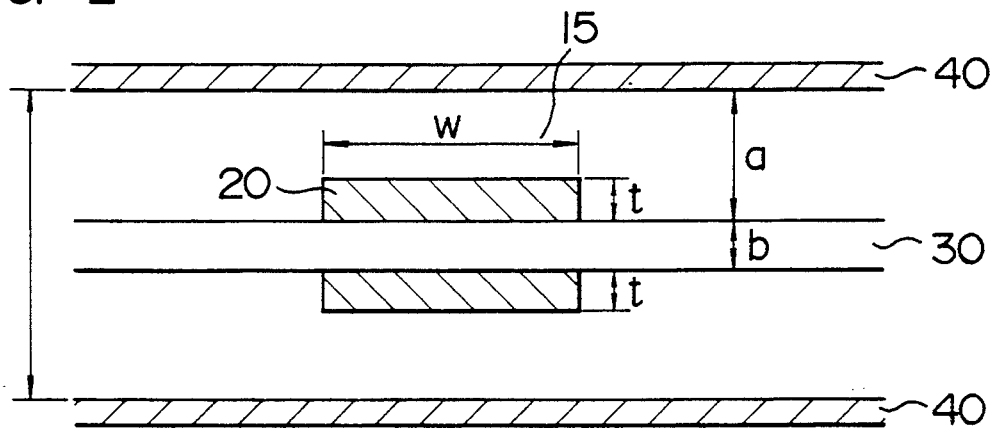
FIG. 2 is a cross-sectional view of a multilayer printed circuit board.

One feature of the present invention resides in sizes of the insulating layers and signal wiring layers of the thus obtained multilayer printed circuit board. FIG. 2 is a cross-sectional view of a multilayer printed circuit board.

In order to make the density of multilayer printed circuit board higher and the signal transmission faster, it is necessary to reduce the circuit size (the circuit layer thickness "t" and the circuit layer width "w") and to make the number of wiring circuit layers larger.

But when the thickness of circuit layer (t) (or signal wiring pattern thickness) is 200 μm or more, there arise problems in that the potential drop becomes large, misregister of individual layers takes place, disconnection takes place due to a difference in size precision of the circuit layers and the insulating layers, peeling of individual layers, and there arises a limitation in circuit design.

In the multilayer printed circuit board of FIG. 2, when the impedance is a predetermined value, the circuit layer width (w) (signal wiring pattern width) becomes smaller and the circuit layer thickness (t) becomes larger with smaller dielectric constant ($\epsilon$) of the insulating layers 15 and 30. In contrast, when the value $\epsilon$ becomes larger, the circuit layer width (w) becomes larger and the circuit layer thickness (t) becomes smaller. In FIG. 2, numeral 15 denotes an insulating layer (an adhesive layer), numeral 20 a signal wiring layer, numeral 30 an insulating layer (a material layer), numeral 40 is a power source supplying layer, mark "a" denotes an adhesive layer thickness, mark "b" denotes a material thickness, and mark "h" denotes an insulating layer thickness.

According to the present invention, by using a cured product of the resin composition containing a biscyanamide compound of the formula (I) as the insulating layers 15 and 30, the value "$\epsilon$" of the insulating layers can be made 3.0 or less, the thickness of the insulating layers (h) can be made 200 to 500 μm, the wiring pattern width (w) (the width of circuit conductor layer 20) can be made 10 to 50 μm, the wiring pattern thickness (t) (the thickness of circuit conductor layer 20) can be made 50 to 200 μm, and the aspect ratio (t/w) can be made 1.0 to 20. Further, by this, the signal transmission delayed time at the circuit conductor layer can be made 6.0 ns/m or less. In addition, by imparting adhesiveness to a metal such as copper of the circuit conductor layer, it is possible to obtain a multilayer printed circuit board with more layers and with larger density.

The thermosetting resin composition containing a biscyanamide compound of the formula (I) can be used as a laminating material for various printed circuit boards, a material for encapsulating semiconductors, an insulating material (film) between semiconductor layers, a coating material for cables, a structural material for connectors, a material for aerospace technology, a material for cars, etc.

Further, according to the present invention, there can be provided an electronic device wherein circuit conductor layers of a multilayer printed circuit board obtained by alternately laminating and bonding insulating layers and circuit conductor layers, are electrically connected via bumps to leads of semiconductor elements such as memory LSI having an integration of 1 megabit or more, each insulating layer having a thickness (h) of 200 to 500 μm and a relative dielectric constant ($\epsilon$) at 1 MHz of 3.0 or less, and each circuit conductor layer having a circuit conductor width (w) of 10 to 50 μm, a circuit conductor thickness (t) of 50 to 200 μm, and an aspect ratio (t/w) of 1.0 to 20.

The present invention still further provides an electronic device wherein at least a semiconductor element and a part of lead wires are coated or/and encapsulated with the fluorine-containing thermosetting resin composition containing a biscyanamide compound preferably having the formula (I), IR spectrum of a cured product of the resin composition with heating having absorptions in IR spectrum due to —NH—, —O—, F, and a melamine ring or an isomelamine ring.

The present invention also provides a semiconductor device wherein an adhesive layer is present between a semiconductor element and a lead portion, said adhesive layer being made from a fluorine-containing thermosetting resin composition containing a biscyanamide compound preferably having the formula (I) with heating at a temperature of 150° C. or higher, said adhesive layer having a glass transition temperature of 200° C. or higher, a resistivity of $1 \times 10^{-5}$ to $1 \times 10^{-3}$ Ω.cm, and a relative dielectric constant of 5.0 or less.

This invention is illustrated by way of Production Examples for synthesizing fluorine-containing biscyana biscyanamide compounds of the formula (I) and Examples for producing multilayer printed circuit boards.

PRODUCTION EXAMPLE 1

Synthesis of 1,1,1,3,3,3-hexafluoro-2,2-bis[4-(4-cyanoamino-2-trifluoromethylphenoxy) phenyl]proane (p-HFCTP-2)

Figure 3:
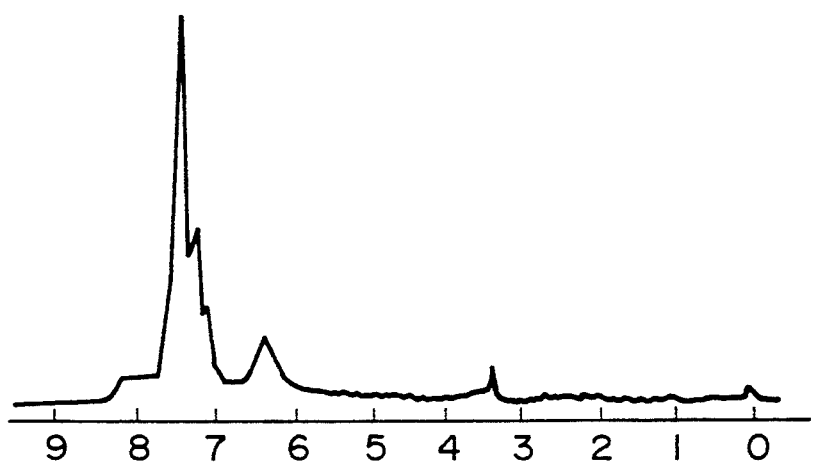
FIG. 3 is an NMR spectrum of 1,1,1,3,3,3-hexafluoro-2,2-bis[4-(4-cyanoamino-2-trifluoromethylphenoxy)-phenyl]propane (p-HFCTP-2).
Figure 4:
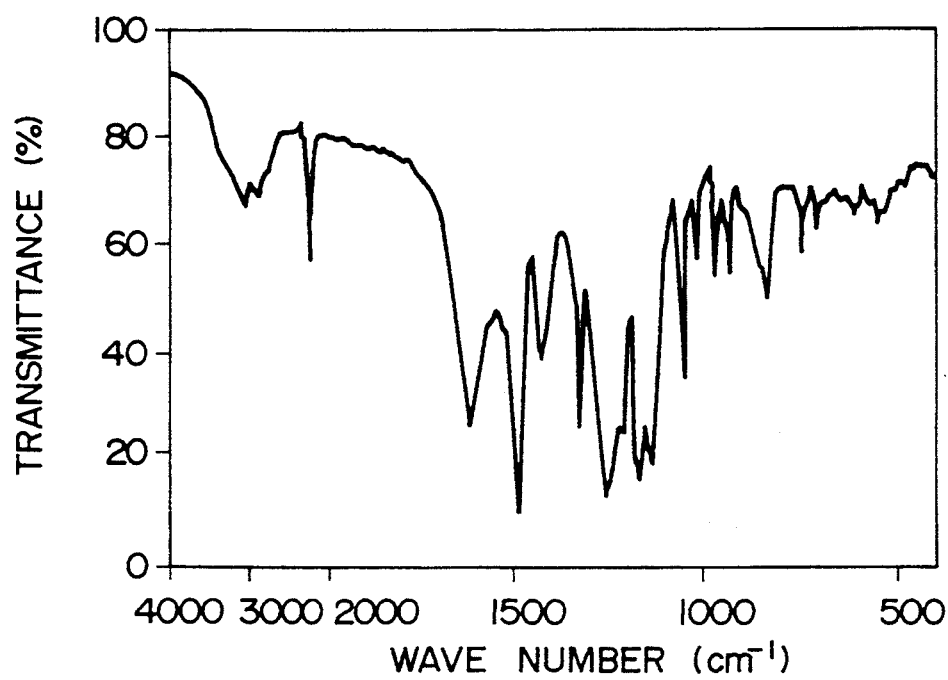
FIG. 4 is an IR spectrum of p-HFCTP-2.

Bromocyanogen in an amount of 63.5 g, and 25.2 g of sodium bicarbonate were dissolved in a mixed solvent of 75 ml of water and 50 ml of dimethylacetamide with sufficient stirring (in a cooled state). To the resulting solution, a solution obtained by dissolving 98.1 g of 1,1,1,3,3,3-hexafluoro-2,2-bis[4-(4-amino-2-trifluoromethylphenoxy)phenyl]propane in 300 ml of dimethylacetamide was added dropwise in about 4 hours while maintaining the cooled state at 0° to 10° C. After dropwise addition, aging was conducted for 12 hours. The resulting reaction solution was dropped in 1000 ml of water with stirring to deposit a pale yellow precipitate. The precipitate was separated by filtration with suction. The resulting precipitate was charged into 1000 ml of water again, washed with water, filtered again and washed with water. The resulting filtered solid was subjected to filtration under reduced pressure (drying conditions; temperature 30° C., pressure 10 mmHg, period 12 hours) to yield 104.8 g of crystals of the objective compound, 1,1,1,3,3,3-hexafluoro-2,2-bis[4-(4-cyanoamino-2-trifluoromethylphenoxy)phenyl]propane (yield 98.2%). The resulting compound (p-HFCTP-2) had a melting point of 55° to 60° C. IR spectrum of said compound is shown in FIG. 4 and NMR spectrum of said compound is shown in FIG. 3.

p-HFCTP-2 is represented by the formula:

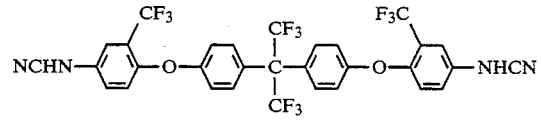

PRODUCTION EXAMPLE 2

Synthesis of 1,1,1,3,3,3-hexafluoro-2,2-bis[4-(4-cyanoamino-3-trifluoromethylphenoxy) phenyl]propane (p-HFCTP-3)

The process of Production Example 1 was repeated except for using 1,1,1,3,3,3-hexafluoro-2,2-bis[4-(4-amino-3-trifluoromethylphenoxy) phenyl]propane in place of 1,1,1,3,3,3-hexafluoro-2,2-bis[4-(4-amino-2-trifluoromethylphenoxy)phenyl]propane to yield 1,1,1,3,3,3-hexafluoro-2,2-bis[4-(4-cyanamide-3-trifluoromethylphenoxy)phenyl]propane (p-HFCTP-3) in yield of 98.0%.

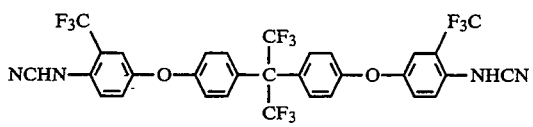

PRODUCTION EXAMPLE 3

Synthesis of 1,1,1,3,3,3-hexafluoro-2,2-bis[4-(3-cyanoamino-5-trifluoromethylphenoxy) phenyl]propane (p-HFCTP-5)

The process of Production Example 1 was repeated except for using 1,1,1,3,3,3-hexafluoro-2,2-bis[4-(3-amino-5-trifluoromethylphenoxy) phenyl]propane in place of 1,1,1,3,3,3-hexafluoro-2,2-bis[4-(4-amino-2-trifluoromethylphenoxy)phenyl]propane to yield 1,1,1,3,3,3-hexafluoro-2,2-bis[4-(3-cyano-5-trifluoromethylphenoxy)phenyl]propane in yield of 98.0%.

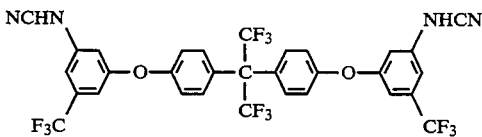

PRODUCTION EXAMPLE 14

Synthesis of bis[(4-cyanoamino-2-trifluoromethylphenoxy)-phenyl]ether

The process of Production Example 1 was repeated except for using 98.1 g of bis[(4-amino-2-trifluoromethylphenoxy)phenyl]ether in place of 98.1 g of 1,1,1,3,3,3-hexafluoro-2,2-bis[4-(4-amino-2-trifluoromethylphenoxy)phenyl]propane to yield bis[(4-cyanoamino--trifluoromethylphenoxy)phenyl]ether in yield of 96.9%.

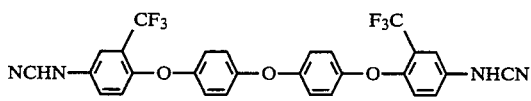

PRODUCTION EXAMPLE 5

The process of Production Example 1 was repeated except for using 90.5 g of bis[(4-amino-2-trifluoromethylphenoxy)phenyl]sulfone in place of 98.1 g of 1,1,1,3,3,3-hexafluoro-2,2-bis[4-(4-amino-2-trifluoromethylphenoxy)phenyl]propane to yield bis[(4-cyanoamino-2-trifluoromethylphenoxy)phenyl]sulfone in yield of 97.7%.

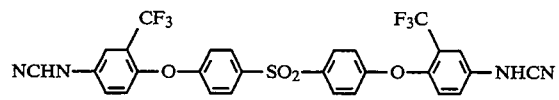

PRODUCTION EXAMPLE 6

Synthesis of bis[(4-cyanoamino-2-trifluoromethylphenoxy)phenyl]sulfide

The process of Production Example 1 was repeated except for using 89.2 g of bis[(4-amino-2-trifluoromethylphenoxy)phenyl]sulfide in place of 98.1 g of 1,1,1,3,3,3-hexafluoro-2,2-bis[4-(4-amino-2-trifluoromethylphenxy) phenyl]propane to yield bis[(4-cyanoamino-2-trifluoromethylphenoxy)phenyl]sulfide in yield of 95.9%.

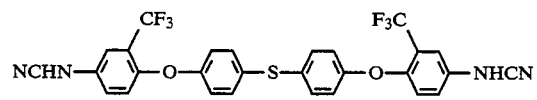

PRODUCTION EXAMPLE 7

Synthesis of bis[(4-cyanoamino-2-trifluoromethylphenoxy)-phenyl]ketone

The process of Production Example 1 was repeated except for using 88.8 g of bis[(4-amino-2-trifluoromethylphenoxy)phenyl]sulfide in place of 98.1 g of 1,1,1,3,3,3-hexafluoro-2,2-bis[4-(4-amino-2-trifluoromethylphenoxy) phenyl]propane to yield bis[(4-cyanoamino-2-trifluoromethylphenoxy)phenyl]ketone in yield of 98.1%.

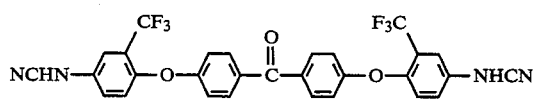

PRODUCTION EXAMPLE 8

Synthesis of 1,1,1,3,3,3-hexafluoro-2,2-bis[4-(4-cyanoamino-2-pentafluoroethylphenoxy) phenyl]propane The process of Production Example 1 was repeated except for using 98.9 g of 1,1,1,3,3,3-hexafluoro-2,2-bis[4-(4-amino-2-pentafluoroethylphenoxy) phenyl]propane in place of 98.1 g of 1,1,1,3,3,3-hexafluoro-2,2-bis[4-(4-amino-2-trifluoromethylphenoxy) phenyl]propane to yield 1,1,1,3,3,3-hexafluoro-2,2-bis[4-(4-cyanoamino-2pentafluoroethylphenoxy) phenyl]propane in yield of 98.4%.

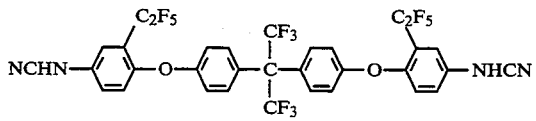

EXAMPLE 1

A varnish for impregnation was prepared by dissolving 100 g of p-HFCTP-2 obtained in Production Example 1 in 200 g of methyl isobutyl ketone and adding thereto 1.0 g of 2,5-dimethyl-2,5-(t-butylperoxy)-hexyne-3 (mfd. by Nippon Oil & Fats Co., Ltd.). D-glass cloth (50 μm in thickness, mfd. by Nitto Boseki Co., Ltd.) was impregnated with the resulting varnish and dried at 110° C. for 10 minutes in a constant temperature bath (in an air atmosphere) to give a coated cloth.

Copper foils were laminated on both sides of the resulting coated cloth and bonded for lamination in a press (conditions: 130° C., 30 kg/cm$^2$, 1 hour for pressing with heating, followed by heating at 250° C. for 1 hour under pressure) to obtain a copper-clad laminate (as shown in FIG. 1A).

The resulting copper-clad laminate was subjected to measurement of a relative dielectric constant, a thermal expansion coefficient, a thermal decomposition temperature, a copper foil peel strength and fire retardance as mentioned below. The results are shown in Table 1.

(1) Relative dielectric constant

According to JIS-C-6481, a relative dielectric constant was measured at 1MHz using an LP Impedance Analyzer 4192 A (mfd. by Hewlet Packard Co.)

(2) Flexural strength

Using an Autograph DDS-5000 (mfd. by Shimadzu Corp.), a sample of 50 mm in width, 45 mm in length and 2 mm in thickness was subjected to measurement at room temperature and 180° C. with a distance between supports of 30 mm and flexing speed of 2 m/min.

(3) Thermal decomposition temperature

Using a High Speed Differential Thermobalance TGD-7000RH (mfd. by Nihon Shinku Riko K. K.), a weight loss by heating was measured in air at a temperature rise rate of 5° C./min. The thermal decomposition temperature was obtained from the temperature at which the weight loss began.

(4) Moisture absorption rate

According to JIS-C-6481, moisture absorption was carried out at 65° C. and 95% RH. The moisture absorption ratio (%) was determined from a saturated moisture absorption amount.

(5) Thermal expansion coefficient

Using a thermophysical Testing Apparatus TMA-1500 (mfd. by Nihon Shinku Riko K.K.), a sample of 6 mm × 6 mm was subjected to a temperature rise at a rate of 2° C./min. The thermal expansion coefficient was obtained from a thermal expansion curve in the range of 50° to 220° C.

(6) Fire retardance

A sample of 12.7 cm long, 1.27 cm long and 0.16 cm thick was evaluated by the vertical method according to UL-94 standards.

(7) Peeling strength

A sample of predetermined size was cut from a copper-clad laminate and measured according to JIS-C-6481 (a peeling speed 5 cm/min.).

(8) Glass transition point

Using a thermal mechanical analyzer, thermal expansion behavior in the thickness direction of a laminate was measured in a compression mood under a pressure of 10 gf/cm$^2$. The glass transition point was determined from an inflection point of thermal expansion coefficient.

EXAMPLE 2

A varnish for impregnation was prepared by dissolving 100 g of p-HFCTP-2 obtained in Production Example 1 and 100 g of 1,1,1,3,3,3-hexafluoro-2,2-bis[4-(4-maleimide-2-trifluoromethylphenoxy) phenyl]propane (p-HFBP) (mfd. by Central Glass Co., Ltd.) in 200 g of methyl ethyl ketone.

A copper-clad laminate was produced in the same manner as described in Example 1. Properties of the copper-clad laminate were measured in the same manner as described in Example 1.

The results are shown in Table 1.

EXAMPLE 3

A varnish for impregnation was prepared by dissolving 100 g of p-HFCTP-2 obtained in Production Example 1 and 100 g of 1,1,1,3,3,3-hexafluoro-2,2-bis[4-(3-maleimide-5-trifluoromethylphenoxy) phenyl]propane (m-HFBP) (mfd. by Central Glass Co., Ltd.) in a mixed solvent of 150 g of acetone and 150 g of ethyl Cellosolve acetate, followed by addition thereto of 0.4 g of dicumyl peroxide (mfd. by Nippon Oil & Fats Co., Ltd.) as a radical polymerization initiator. Q-glass cloth (50 μm in thickness, mfd. by Nitto Boseki Co., Ltd.) was impregnated with the resulting varnish and dried at 110° C. for 10 minutes in a constant temperature bath (in an air atmosphere) to give a coated cloth.

A copper-clad laminate was produced in the same manner as described in Example 1 using the resulting coated cloth. Properties of the copper-clad laminate were measured in the same manner as described in Example 1.

The results are shown in Table 1.

EXAMPLE 4

A varnish for impregnation was prepared by dissolving 100 g of p-HFCTP-2 obtained in Production Example 1 and 100 g of 1,1,1,3,3,3-hexafluoro-2,2-bis-(4-cyanatophenyl)propane (mfd. by Manac Co., Ltd.) in 200 g of N,N-dimethylformamide, heating at 120° C. for 1 hour, cooling to room temperature, and adding 0.4 g of dicumyl peroxide (mfd. by Nippon Oil & Fats Co., Ltd.) as radical polymerization initiator. E-glass cloth (50 μm in thickness, mfd. by Nitto Boseki Co., Ltd.) was impregnated with the resulting varnish and dried at 110° C. for 10 minutes in a constant temperature bath (in an air atmosphere) to give a coated cloth.

A copper-clad laminate was produced in the same manner as described in Example 1 using the resulting coated cloth. Properties of the copper-clad laminate were measured in the same manner as described in Example 1.

The results are shown in Table 1.

EXAMPLE 5

A varnish for impregnation was prepared by dissolving 100 g of m-HFCTP obtained in Production Example 2 and 50 g of 1,1,1,3,3,3-hexafluoro-2,2-bis[4-4-cyanamidephenoxy)phenyl]propane (HFCP) (mfd. by Manac Co., Ltd.) in 200 g of methyl isobutyl ketone. T-glass cloth (50 μm in thickness, mfd. by Nitto Boseki Co., Ltd.) was impregnated with the resulting varnish and dried at 120° C. for 10 minutes in a constant temperature bath (in an air atmosphere) to give a coated cloth.

A copper-clad laminate was produced by piling copper foils on both sides of the resulting coated cloth and bonding for lamination in a press (conditions: 150° C., 20 kg/cm² 1 hour for reaction, followed by heating at 250° C. for 1 hour and at 280° C. for 1 hour under pressure). Properties of the copper-clad laminate were measured in the same manner as described in Example 1.

The results are shown in Table 1.

EXAMPLE 6

A varnish for impregnation was prepared by dissolving 100 g of p-HFCTP-2 obtained in Production Example 1 and 100 g of 2,2-bis[4-(4-maleimidephenoxy)phenyl]propane (BMPP) (mfd. by Hitachi Chemical Co., Ltd.) in 200 g of methyl isobutyl ketone, and reacting with heating at 100° C. for 1 hour. Aramide cloth (50 μm in thickness, mfd. by Asahi Schwebel Co.) was impregnated with the resulting varnish and dried at 110° C. for 10 minutes in a constant temperature bath (in an air atmosphere) to give a coated cloth.

A copper-clad laminate was produced by piling copper foils on both sides of the resulting coated cloth and bonding for lamination in a press (conditions: 130° C., 40 kg/cm², 1 hour for reaction followed by heating at 250° C. for 2 hours under pressure). Properties of the copper-clad laminate were measured in the same manner as described in Example 1.

The results are shown in Table 1.

COMPARATIVE EXAMPLE 1

A varnish for impregnation was prepared by dissolving 100 g of bis[(4-cyanamide-3-methyl)phenyl]methane (mfd. by Manac Co., Ltd.) and 100 g of bis(4-maleimidephenyl)methane in 200 g of N,N-dimethylformamide. Q-glass cloth (50 μm in thickness, mfd. by Nitto Boseki Co., Ltd.) was impregnated with the resulting varnish and dried at 150° C. for 10 minutes in constant temperature air to give a coated cloth.

A copper-clad laminate was produced by piling copper foils on both sides of the resulting coated cloth and bonding for lamination in a press (conditions: 170° C., 1 hour for reaction, followed by heating at 250° C. for 1 hour under pressure of 20 kg/cm²). Properties of the copper-clad laminate were measured in the same manner as described in Example 1.

The results are shown in Table 1.

TABLE 1

| Example No. | Relative dielectric constant (ε) | Glass transition point (°C.) | Thermal decomposition temperature (°C.) | Peel strength (kg/cm) | Fire retardance UL-94 |
| --- | --- | --- | --- | --- | --- |
| Example 1 | 2.8 | 280 | 440 | 1.2 | V-O |
| Example 2 | 2.8 | 240 | 410 | 1.2 | V-O |
| Example 3 | 2.9 | 250 | 400 | 1.2 | V-O |
| Example 4 | 2.9 | 260 | 380 | 1.2 | V-O |
| Example 5 | 2.9 | 220 | 400 | 1.0 | V-O |
| Example 6 | 2.9 | 230 | 400 | 1.2 | V-O |
| Comparative Example 1 | 3.4 | 270 | 380 | 1.1 | V-O |

EXAMPLE 8

A varnish was prepared by dissolving 100 g of p-HFCTP-5 obtained in Production Example 3 in 200 g of methyl isobutyl ketone, and adding thereto 0.5 g of dicumyl peroxide (mfd. by Nippon Oil & Fats Co., Ltd.) as a radical polymerization initiator. The varnish was coated on a Myler sheet made from polyester, followed by drying at 110° C. for 10 minutes in a constant temperature bath (in an air atmosphere) to give a resin powder.

The resulting resin powder in an amount of 50 g was cured in a press using a spacer of 1.2 cm long, 14 cm wide and 2 mm thick (conditions: 130° C., 30 kg/cm², 1 hour with heating under pressure, followed by heating at 250° C. for 1 hour under pressure) to give a resin plate.

The resulting resin plate was subjected to measurement of the relative dielectric constant, the thermal decomposition temperature, peel strength and fire retardance in the same manner as described in Example 1.

The results are shown in Table 2.

EXAMPLE 8

A resin plate was prepared in the same manner as described in Example 7 except for using 100 g of bis[(4-cyanoamino-2-trifluoromethylphenoxy)phenyl]ether obtained in Production Example 4 and evaluated in the same manner as described in Example 7.

EXAMPLE 9

A resin plate was prepared in the same manner as described in Example 7 except for using 100 g of bis[(4-cyanoamino-2-trifluoromethylphenoxy)phenyl]sulfone obtained in Production Example 5 and evaluated in the same manner as described in Example 7.

EXAMPLE 10

A resin plate was prepared in the same manner as described in Example 7 except for using 100 g of bis[(4-cyanoamino-2-trifluoromethylphenoxy)phenyl]sulfide obtained in Production Example 6 and evaluated in the same manner as described in Example 7.

EXAMPLE 11

A resin plate was prepared in the same manner as described in Example 7 except for using 100 g of bis[(4-cyanoamino-2-trifluoromethylphenoxy)phenyl]ketone obtained in Production Example 7 and evaluated in the same manner as described in Example 7.

EXAMPLE 12

A resin plate was prepared in the same manner as described in Example 7 except for using 100 g of 1,1,1,3,3,3-hexafluoro-2,2-bis[(4-cyanoamino-2-pentafluoroethylphenoxy) phenyl]propane obtained in Production Example 8 and evaluated in the same manner as described in Example 7.

EXAMPLE 13

A varnish was prepared by dissolving 50 g of p-HFCTP-2 obtained in Production Example 1 and 50 g of p-HFCTP-5 obtained in Production Example 3 in 100 g of dimethylformamide, and adding thereto 0.8 g of 2,5-dimethyl-2,5-(t-butylperoxy)hexyne-3 (mfd. by Nippon Oil Fats Co., Ltd.) as a radical polymerization initiator. The varnish was coated on a Myler sheet made from polyester, followed by drying at 140° C. for 10 minutes in a constant temperature bath (in an air atmosphere) to give a resin powder.

A resin plate was prepared in the same manner as described in Example 7 except for using 50 g of the resulting resin powder and evaluated in the same manner as described in Example 7.

The results of Examples 7 to 14 are listed in Table 2.

TABLE 2

| Example No. | Relative dielectric constant ($\epsilon$) | Thermal decomposition temperature (°C.) | Peel strength (kg/cm) | Fire retardance LU-94 |
| --- | --- | --- | --- | --- |
| Example 7  | 2.6 | 410 | 1.1 | V-O |
| Example 8  | 2.5 | 400 | 1.1 | V-O |
| Example 9  | 2.5 | 420 | 1.4 | V-O |
| Example 10 | 2.5 | 420 | 1.5 | V-O |
| Example 11 | 2.6 | 420 | 1.2 | V-O |
| Example 12 | 2.5 | 410 | 1.0 | V-O |
| Example 13 | 2.6 | 400 | 1.5 | V-O |

EXAMPLE 14, COMPARATIVE EXAMPLE 2

An adhesive varnish was prepared by dissolving 100 g of 1,1,1,3,3,3-hexafluoro-2,2-bis[4-(4-cyanamide-2-trifluoromethylphenoxy)phenyl]propane (p-HFCTP) and 50 g of 1,1,1,3,3,3-hexafluoro-2,2-bis[4-(4-maleimide-2-trifluoromethylphenoxy)phenyl]propane (mfd. by Central Glass Co., Ltd.) in 200 g of methyl ethyl ketone, reacting at 100° C. for 120 minutes to form a prepolymer, cooling and adding thereto 1 g of dicumyl peroxide (mfd. by Nippon Oil & Fats Co., Ltd.) as a curing accelerator.

On the surface of a support member (a copper support member), the resulting adhesive varnish was coated, followed by mounting of silicon semiconductor element. The adhesive varnish was cured with heating at 220° C. for 10 seconds.

Shear adhesive strength was measured by using a push bull gage. Further, a water absorption rate was measured according to JIS-K 6911 in order to examine moisture resistance of a cured product of adhesive.

The water absorption rate was evaluated by using a cured resin plate of 50 mm in diameter and 3 mm in thickness, immersing the resin plate in water at 23° C. for 24 hours and measuring the weight change after the immersion.

The adhesive retention rate was evaluated by allowing the above-mentioned specimen to stand in a supersaturated steam cooker at 121° C. under a pressure of 2 atmospheres (pressure cooker test), and measuring the time required for making the initial value of shear adhesive strength 90%.

For comparison, a test specimen was prepared by using an epoxy adhesive EN-4050 (mfd. by Hitachi Chemical Co., Ltd.) and the properties were evaluated in the same manner as mentioned above (Comparative Example 2).

The results are shown in Table 3.

TABLE 3

| Example No. | Example 14 | Comparative Example 2 |
| --- | --- | --- |
| Curing properties | 220° C./10 sec. | 250° C./20 sec. |
| Initial shear adhesive strength (kg/cm$^2$) | 70 | 60 |
| Shear adhesive strength retention rate (In steam of 121° C., 2 atm.) | >100 hrs | 50 hrs |
| Water absorption rate (%) | <0.01 | 0.15 |
| Thermal decomposition temperature (°C.) | 410 | 310 |

EXAMPLE 15

A resin composition for encapsulating semiconductor was prepared by mixing 20 g of p-HFCTP-2 obtained in Production Example 1, 30 g of 2,2-bis[4-(4-maleimidephenoxy)phenyl]propane, 50 g of novolak type epoxy resin(ECN 1273, mfd. by Ciba-Geigy Ltd., epoxy equivalent 225), 3 g of imidazole (2E4MZ-CN, mfd. by Shikoku Chemicals Corp.), 2 g of epoxysilane (KBM 303, mfd. by Shin-Etsu Chemical Co., Ltd.), as fillers 200 g of crystalline silica powder and 250 g of molten quatz glass, as a colorant 2 g of carbon black, kneading for 7–8 minutes using a two-roll mill, cooling and grinding.

A resin encapsulated semiconductor device was produced by transfer molding the resulting resin composition on a 4M bit memory LSI (D-RAM) at 180° C. under a pressure of 70 kg/cm$^2$ for 1.5 minutes.

Then, 50 resin encapsulated semiconductor devices obtained as mentioned above were allowed to stand in a constant temperature bath at 150° C. for 1000 hours, followed by testing of electric conductivity.

As a result, no disconnection (breaking of wires) was found.

When the resin encapsulated semiconductor devices were allowed to stand in supersaturated steam heated at 121° C. under 2 atmospheres for 1500 hours, no disconnection was found.

What is claimed is:

1. A fluorine-containing thermosetting resin composition comprising 100 parts by weight of a biscyanamide compound represented by the formula:

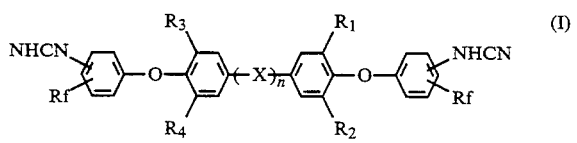

(I)

wherein X is —O—, —S—, —SO—, —SO$_2$—, —CO—, or

R$_1$, R$_2$, R$_3$, R$_4$, R$_5$ and R$_6$ are independently a hydrogen atom, a lower alkylgroup, a lower fluoroalkyl group, or an allylene group; n is zero or an integer of 1; Rf is a perfluoroalkyl group having 1 to 10 carbon atoms; and the cyanamide group is positioned at a m- or p-position with respect to the ether linkage, and 10 to 900 parts by weight of at least one secondary thermosetting component selected from the group consisting of compound having one or more ethylenically unsaturated double bonds, epoxy compounds, phenolic compounds, melamine compounds, compounds having an N-substituted unsaturated imido group, cyanate compounds, and isocyanate compounds.

2. An insulating cured product obtained by heating at 100° to 250° C. a fluorine-containing thermosetting resin composition comprising a biscyanamide compound of the formula:

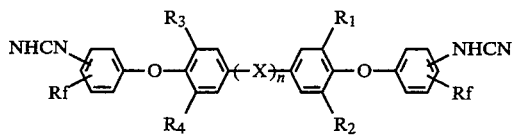 (I)

wherein X is —O—, —S—, —SO—, —SO$_2$—, —CO—, or

$R_1$, $R_2$, $R_3$, $R_4$, $R_5$ and $R_6$ are independently a hydrogen atom, a lower alkyl group, a lower fluoroalkyl group, or an allylene group; n is zero or an integer of 1; Rf is a perfluoroalkyl group having 1 to 10 carbon atoms; the cyanamide group is positioned at a m- or p-position with respect to the ether linkage, said cured product having melamine rings and/or isomelamine rings, a relative dielectric constant at 1 MHz of 3.0 or less, a 5% weight loss temperature of 400° C. or higher, and fire retardance of V-O according to UL-90 standards.

3. A curable sheet obtained by impregnating a woven fabric or non-woven fabric and drying, with a fluorine-containing thermosetting resin composition comprising a biscyanamide compound of the formula:

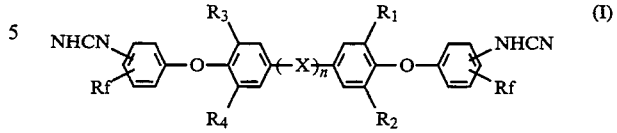 (I)

wherein X is —O—, —S—, —SO—, —SO$_2$—, —CO—, or

$R_1$, $R_2$, $R_3$, $R_4$, $R_5$ and $R_6$ are independently a hydrogen atom, a lower alkyl group, a lower fluoroalkyl group, or an allylene group; n is zero or an integer of 1; Rf is a perfluoroalkyl group having 1 to 10 carbon atoms; and the cyanamide group is positioned at a m- or p-position with respect to the ether linkage.

4. A curable sheet according to claim 3, wherein the resin composition has a viscosity of $10^2$ to $10^4$ poises when melted with heating at 100° to 170° C. and a capacity for forming hetero rings comprising melamine rings or isomelamine rings or both melamine rings and isomelamine rings when heated at 180° C. or higher.

* * * * *